US012336288B2

(12) United States Patent
Lee et al.

(10) Patent No.: US 12,336,288 B2
(45) Date of Patent: Jun. 17, 2025

(54) ARRAY OF VERTICAL TRANSISTORS AND METHOD USED IN FORMING AN ARRAY OF VERTICAL TRANSISTORS

(71) Applicant: Micron Technology, Inc., Boise, ID (US)

(72) Inventors: Yi Fang Lee, Boise, ID (US); Jaydip Guha, Boise, ID (US); Lars P. Heineck, Boise, ID (US); Kamal M. Karda, Boise, ID (US); Si-Woo Lee, Boise, ID (US); Terrence B. McDaniel, Boise, ID (US); Scott E. Sills, Boise, ID (US); Kevin J. Torek, Meridian, ID (US); Sheng-Wei Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 40 days.

(21) Appl. No.: 17/947,401

(22) Filed: Sep. 19, 2022

(65) Prior Publication Data
US 2023/0014320 A1    Jan. 19, 2023

Related U.S. Application Data

(62) Division of application No. 16/934,607, filed on Jul. 21, 2020, now Pat. No. 11,488,981.

(51) Int. Cl.
*H10D 86/60* (2025.01)
*H10D 86/00* (2025.01)
(Continued)

(52) U.S. Cl.
CPC ............. *H10D 86/60* (2025.01); *H10D 86/01* (2025.01); *H10D 86/0221* (2025.01);
(Continued)

(58) Field of Classification Search
CPC . H01L 27/1225; H01L 21/84; H01L 27/1203; H01L 27/124; H01L 27/127;
(Continued)

(56) References Cited

U.S. PATENT DOCUMENTS 9,698,272 B1     7/2017  Ikeda et al.
2009/0050867 A1*  2/2009  Wells ................. H01L 23/5226
                                                   257/E47.001
(Continued)

*Primary Examiner* — Douglas W Owens
(74) *Attorney, Agent, or Firm* — Wells St. John P.S.

(57) ABSTRACT

An array of vertical transistors comprises spaced pillars of individual vertical transistors that individually comprise an upper source/drain region, a lower source/drain region, and a channel region vertically there-between. The upper source/drain region comprises a conductor oxide material in individual of the pillars. The channel region comprises an oxide semiconductor material in the individual pillars. The lower source/drain region comprises a first conductive oxide material in the individual pillars atop and directly against a second conductive oxide material in the individual pillars. Horizontally-elongated and spaced conductor lines individually interconnect a respective multiple of the vertical transistors in a column direction. The conductor lines individually comprise the second conductive oxide material atop and directly against metal material. The first conductive oxide material, the second conductive oxide material, and the metal material comprise different compositions relative one another. The second conductive oxide material of the conductor lines is below and directly against the second conductive oxide material of the lower source/drain region of the individual pillars of the respective multiple vertical transistors. Horizontally-elongated and spaced conductive gate lines are individually operatively aside the oxide semiconductor material of the channel region of the individual pillars and individually interconnect a respective plurality of the vertical transistors in a row direction. A conductive (Continued)

structure is laterally-between and spaced from immediately-adjacent of the spaced conductor lines in the row direction. The conductive structures individually comprise a top surface that is higher than a top surface of the metal material of the conductor lines. Other embodiments, including method, are disclosed.

19 Claims, 13 Drawing Sheets

(51) Int. Cl.
  *H10D 86/01* (2025.01)
  *H10D 86/40* (2025.01)
  *H10D 86/80* (2025.01)
(52) U.S. Cl.
  CPC ......... *H10D 86/201* (2025.01); *H10D 86/423* (2025.01); *H10D 86/441* (2025.01); *H10D 86/481* (2025.01); *H10D 86/80* (2025.01)

(58) Field of Classification Search
  CPC . H01L 27/1255; H01L 27/13; H01L 27/1248; H01L 29/42392; H10B 12/315; H10B 12/05; H10B 51/00; H10B 51/30; H10D 86/423; H10D 86/60; H10D 86/01; H10D 86/201; H10D 86/441; H10D 86/0221; H10D 86/481; H10D 86/80; H10D 86/451; H10D 30/501–04; H10D 30/06–09; H10D 30/6735
  See application file for complete search history.

(56) References Cited

U.S. PATENT DOCUMENTS

| | | | |
|---|---|---|---|
| 2020/0111908 A1 | 4/2020 | Sills et al. | |
| 2021/0358930 A1* | 11/2021 | Hopkins | H10B 43/35 |
| 2021/0358939 A1* | 11/2021 | Hopkins | H10B 41/10 |
| 2021/0384216 A1* | 12/2021 | Greenlee | H10B 43/10 |

* cited by examiner

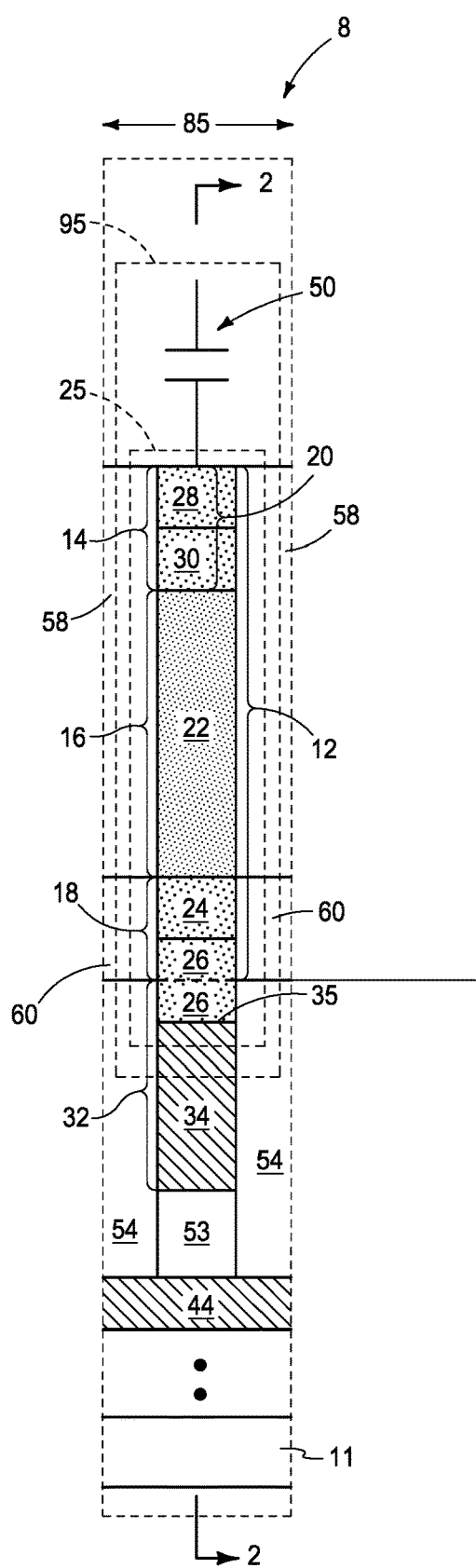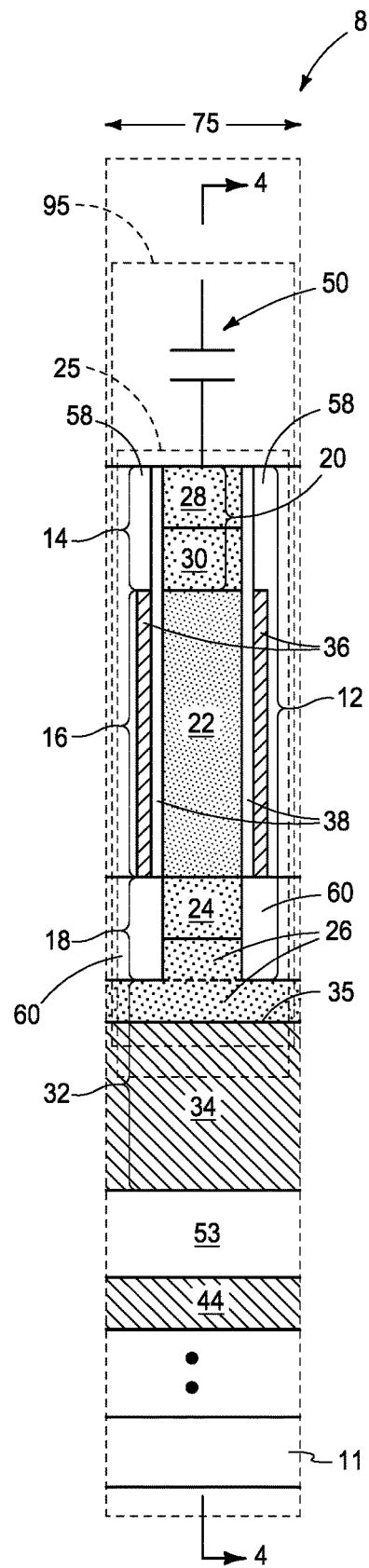
FIG. 5  FIG. 6

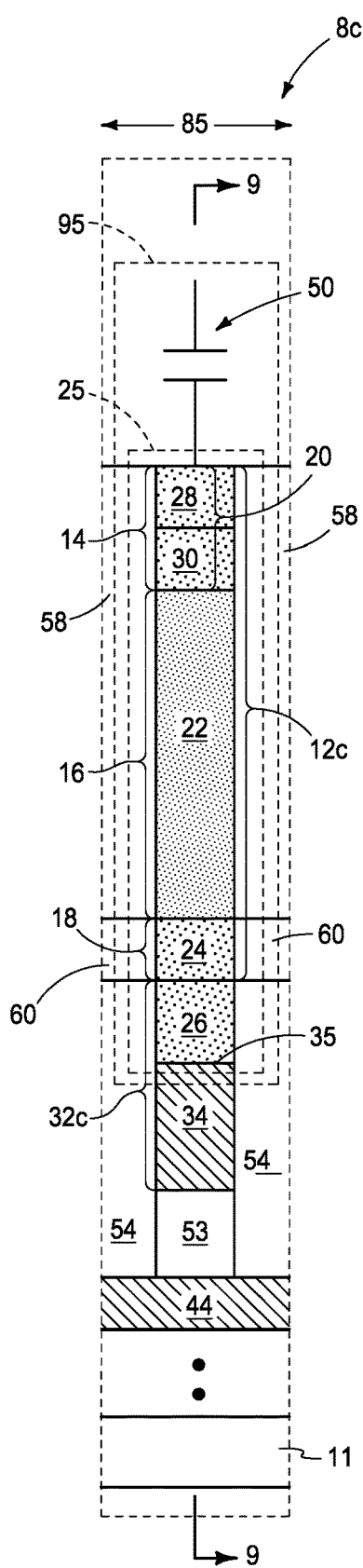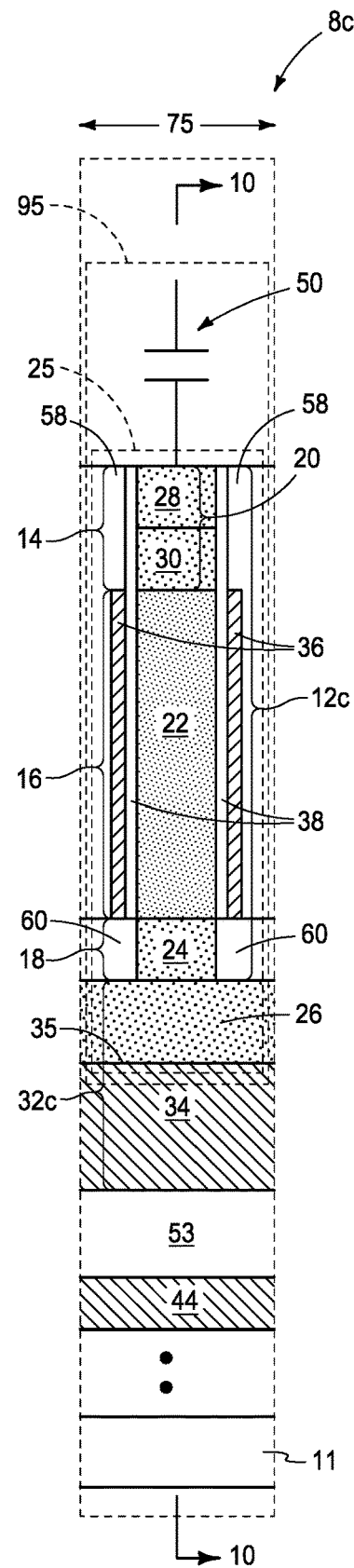
FIG. 11  FIG. 12

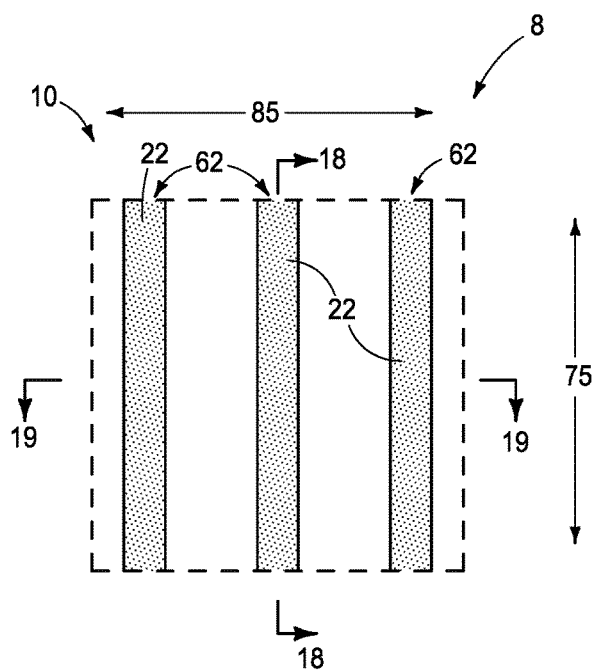
FIG. 17
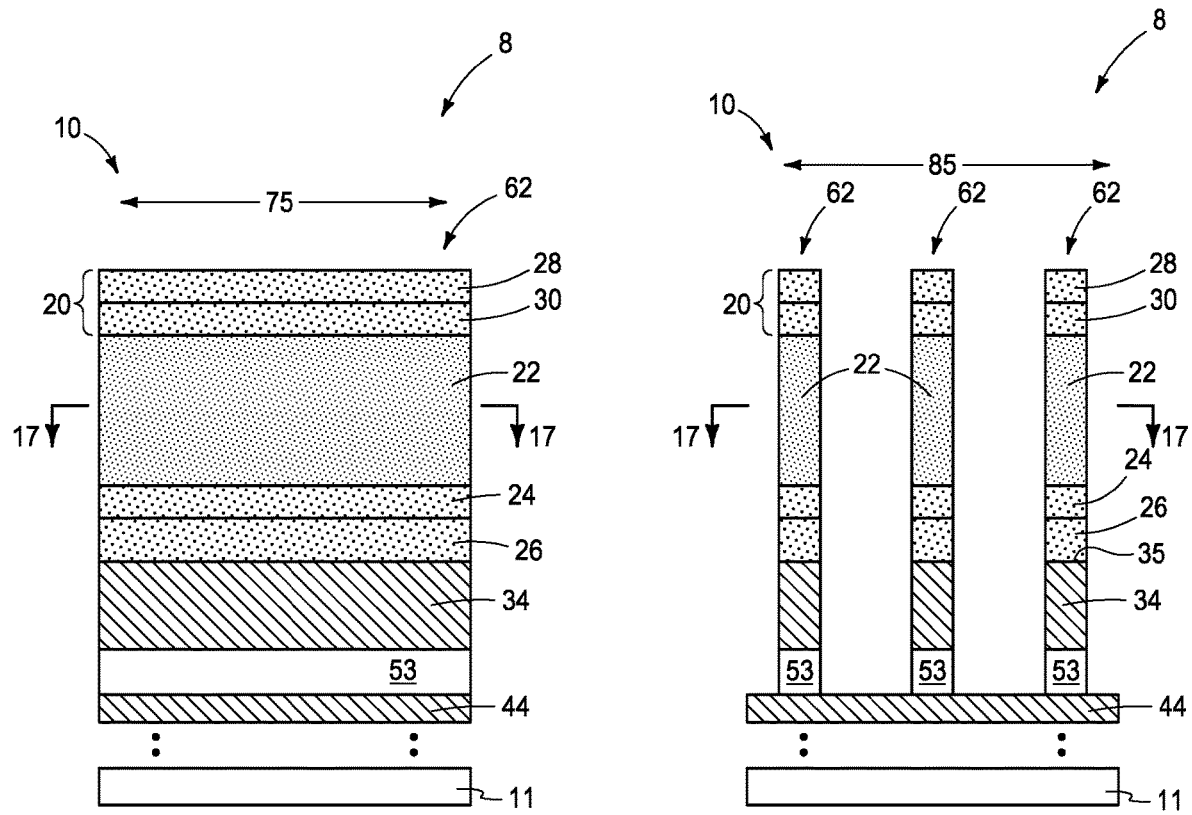
FIG. 18  FIG. 19

ARRAY OF VERTICAL TRANSISTORS AND METHOD USED IN FORMING AN ARRAY OF VERTICAL TRANSISTORS

RELATED PATENT DATA

This patent resulted from a divisional application of U.S. patent application Ser. No. 16/934,607, filed Jul. 21, 2020, entitled "Array Of Vertical Transistors And Method Used In Forming An Array Of Vertical Transistors", naming Yi Fang Lee, Jaydip Guha, Lars P. Heineck, Kamal M. Karda, Si-Woo Lee, Terrence B. McDaniel, Scott E. Sills, Kevin J. Torek, and Sheng-Wei Yang as inventors, the disclosure of which is incorporated by reference.

TECHNICAL FIELD

Embodiments disclosed herein pertain to arrays of vertical transistors and to methods of forming an array of vertical transistors.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. The gate insulator may be capable of being programmed between at least two retentive capacitive states whereby the transistor is non-volatile. Alternately, the gate insulator may not be so capable whereby the transistor is volatile. Regardless, field effect transistors may also include additional structure, for example a reversibly programmable charge-storage region as part of the gate construction between the gate insulator and the conductive gate.

A capacitor is another type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Capacitors and transistors may of course be used in integrated circuitry other than memory circuitry and fabricated into arrays that may or may not be at least part of a memory array.

BRIEF DESCRIPTION OF THE DRAWINGS

FIG. 5 is an enlargement of a portion of FIG. 4.

FIG. 6 is an enlargement of a portion of FIG. 2.

FIGS. 9-12 are diagrammatic cross-sectional views of an array of vertical transistors in accordance with an embodiment of the invention.

FIGS. 17-35 are diagrammatic sequential sectional and/or enlarged views of a method of forming the construction of FIGS. 1-6 in accordance with some embodiments of the invention.

DETAILED DESCRIPTION OF EXAMPLE EMBODIMENTS

Figure 1:
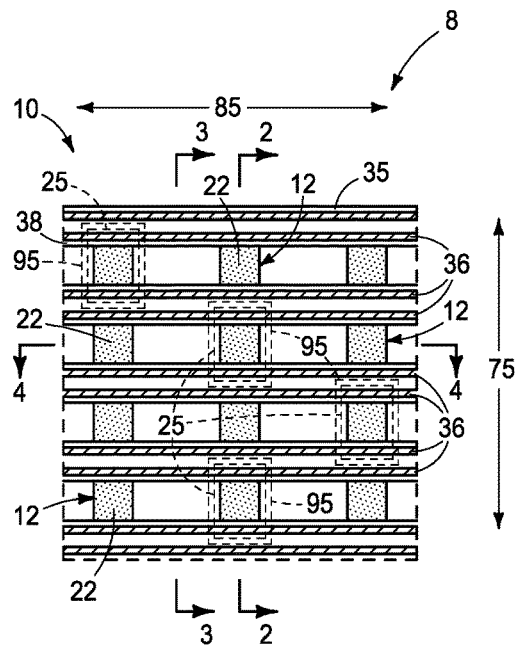
FIG. 1 is a diagrammatic cross-sectional view of an array of vertical transistors in accordance with an embodiment of the invention and is taken through line 1-1 in FIGS. 2, 3, and 4.
Figure 2:
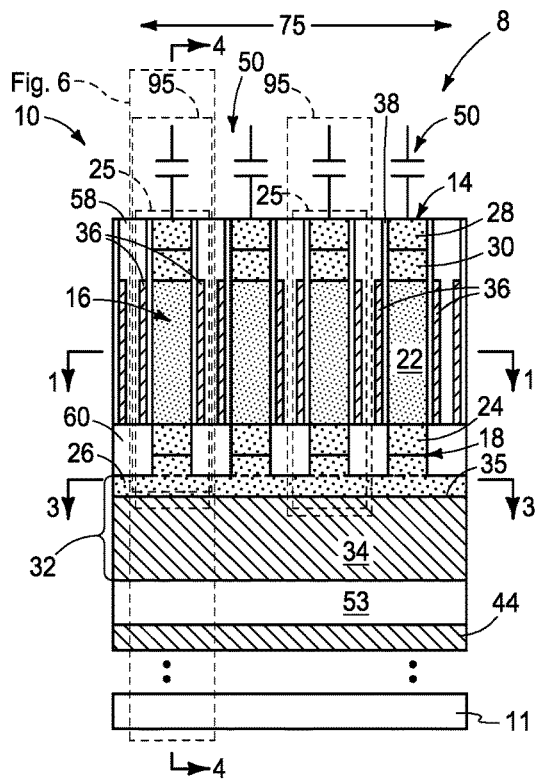
FIG. 2 is a diagrammatic cross-sectional view taken through line 2-2 in FIGS. 1 and 4.

Embodiments of the invention include methods of forming an array of vertical transistors, for example as may be used in memory or other integrated circuitry. Embodiments of the invention also include an array of vertical transistors independent of method of manufacture.

A portion of a first example array 10 of vertical transistors 25 is shown and described with reference to FIGS. 1-6. Such show a construction 8 comprising a base substrate 11 that may comprise any one or more of conductive/conductor/conducting, semiconductive/serniconductor/semiconducting, and insulative/insulator/insulating (i.e., electrically herein) materials. Various materials are above base substrate 11. Materials may be aside, elevationally inward, or elevationally outward of the FIGS. 1-6-depicted materials. For example, other partially or wholly fabricated components of integrated circuitry may be provided somewhere above, about, or within base substrate 11. Control and/or other peripheral circuitry for operating components within an array of transistors may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Array 10 comprises spaced pillars 12 of individual vertical transistors 25. Pillars 12 individually comprise an upper source/drain region 14, a lower source/drain region 18, and a channel region 16 vertically there-between. Upper source/drain region 14 comprises a conductor oxide material 20 (FIGS. 5 and 6) in individual pillars 12. Channel region 16 comprises an oxide semiconductor material 22 in individual pillars 12, Lower source/drain region 18 comprises a first conductive oxide material 24 in individual pillars 12 atop and directly against a second conductive oxide material 26 in individual pillars 12. In this document, each of the two-word phrases "conductor oxide" and "conductive oxide" includes oxides that are degenerate semiconductors as well as oxides that are more electrically conductive than degenerate semiconductors. In one embodiment, first conductive oxide material 24 in individual pillars 12 is thicker than second conductive oxide material 26 in individual pillars 12.

Array 10 comprises horizontally-elongated and spaced conductor lines 32 (e.g., digitlines) that individually interconnect a respective multiple (e.g., a column) of vertical transistors 25 in a column direction 75. Conductor lines 32 individually comprise second conductive oxide material 26 that is atop and directly against metal material 34. Second conductive oxide material 26 of conductor lines 32 is below and directly against second conductive oxide material 26 of lower source/drain region 18 of individual pillars 12 of the respective multiple vertical transistors 25. In one embodiment, second conductive oxide material 26 of conductor lines 32 and second conductive oxide material 26 of lower source/drain region 18 of individual pillars 12 are of the same thickness relative one another. In one embodiment, metal material 34 in conductor lines 32 is thicker than second conductive oxide material 26 in conductor lines 32. Regardless, first conductive oxide material 24, second conductive oxide material 26, and metal material 34 comprise different compositions relative one another. In one embodiment, metal material 34 comprises at least one of an elemental metal, an alloy of elemental metals, or a conductive metal nitride. In one embodiment, metal material 34 is devoid of any detectable (by any existing or future-developed manners) conducting oxide.

In one embodiment, conductor oxide material 20 of upper source/drain region 14 comprises a first conductor oxide material 28 above and directly against a second conductor oxide material 30, with the first and second conductor oxide materials comprising different compositions relative one another. In one embodiment, first conductor oxide material 28 and second conductive oxide material 26 are of the same composition relative one another. In one embodiment, second conductor oxide material 30 and first conductive oxide material 24 are of the same composition relative one another.

Example conductive oxide materials and example conductor oxide materials are one or more of indium tin oxide, indium oxide, tin oxide, zinc oxide, titanium oxide, and ruthenium oxide (that may be stoichiometric or non-stoichiometric). Example oxide semiconductor materials 22 of channel region 16 are one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_x$-$Ga_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), , zirconium indium zinc oxide ($Zr_xIn_yZn_zO$), hafnium indium zinc oxide ($Hf_xIn_yZn_aO$), tin indium zinc oxide ($Sn_xInyZnzO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. Formulae including at least one of "x," "y," "z," and "a" (e.g., $Zn_x,Sn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "a" atoms of a further element (if any) for every one atom of oxygen (O). As the formulae are representative of relative atomic ratios and not strict chemical structure, channel material 22 may comprise one or more stoichiometric compounds and/or one or more non-stoichiometric compounds, and values of "x," "y," "z," and "a" may be integers or may be non-integers. As used herein, the term "non-stoichiometric" means and includes a chemical compound with an elemental composition that cannot be represented by a ratio of well-defined natural numbers and is in violation of the law of definite proportions.

Horizontally-elongated and spaced conductive gate lines 36 are individually operatively aside oxide semiconductor material 20 of channel region 16 of individual pillars 12 and individually interconnect a respective plurality (e.g., a row) of vertical transistors 25 in a row direction 85. Gate lines 36 may individually be along only one side of channel region 16 (not shown), be along both sides of channel region 16 (as shown), or be gate-all-around channel region 16 (not shown). Example conductive materials for gate lines 36 include metal materials (the same or different as metal material 34) and/or conductively-doped semiconductor material. A gate insulator 38 is between gate lines 36 and oxide semiconductor material 22 of channel region 16 of individual pillars 12. Such may comprise any existing or future-developed gate insulator material, including for example reversibly-programmable materials such as ferroelectrics. Insulating materials 58 and 60 (e.g., silicon nitride and/or silicon dioxide) are laterally-between pillars 12 and gate lines 36.

A conductive structure 40 is laterally-between and spaced from immediately-adjacent spaced conductor lines 32 in row direction 85. Conductive structures 40 individually comprise a top surface 42 that is higher than a top surface 35 of metal material 34 of conductor lines 32. In one embodiment and as shown, conductive structures 40 are conductive lines 46 that are horizontally-elongated in column direction 75 along immediately-adjacent conductor lines 32. In one embodiment and as shown, conductive structures 40 directly electrically couple to a common conductor 44 (e.g., a continuous blanket plate 44 within array 10) that is spaced below conductor lines 32. Insulator material 53 (e.g., silicon nitride and/or silicon dioxide) is vertically between conductor lines 32 and common conductor 44. Insulator material 54 (e.g., silicon nitride and/or silicon dioxide) is laterally-between conductor lines 32 and conductive structures 40. In one ideal embodiment, conductive structures 40 in operation are connected to a suitable potential (e.g., by plate 44) to function as parasitic-capacitance buffers between immediately-adjacent conductor lines 32, ideally eliminating parasitic capacitance there-between.

Vertical transistors 25 may comprise individual memory cells 95 of a memory array (e.g., array 10). For example, an additional programmable structure (not shown) may be provided as part of pillars 12 of vertical transistors 25. Alternately and/or additionally, gate insulator 38 may be programmable to provide different set threshold voltage states of transistors 25 in operation, for example being ferroelectric. Alternately and/or additionally, and as shown, a plurality of memory elements 50 may be individually directly electrically coupled to individual upper source/drain regions 14 of individual pillars 12, thus comprising individual memory cells 95. Example memory elements 50 are schematically shown as individually being a capacitor, for example that may be volatile or non-volatile between two capacitive states. Any alternate or future-developed memory element may be used.

Any other attribute(s) or aspect(s) as shown and/or described herein with respect to other embodiments may be used in the embodiments shown and described with reference to the above embodiments.

The FIGS. 1-6 depicted embodiment shows conductive structures 40 as comprising (e.g., being) conductive lines 46. Alternate constructions are contemplated, for example a construction 8a as shown and described with reference to FIG. 7 (compared to the construction of FIG. 3). Like numerals from the above-described embodiments have been used where appropriate, with some construction differences being indicated with the suffix "a" or with different numerals. Example conductive structures 40a comprise conductive pillars 57 that are spaced relative one another in/along column direction 75 along immediately-adjacent conductor lines 32. Any other attribute(s) or aspect(s) as shown and/or described herein with respect to other embodiments may be used. The embodiment of FIGS. 1-6 is preferred over that of FIG. 7 in that such better reduces electric field and thereby parasitic capacitance diagonally between immediately-adjacent conductor lines 32.

Figure 3:
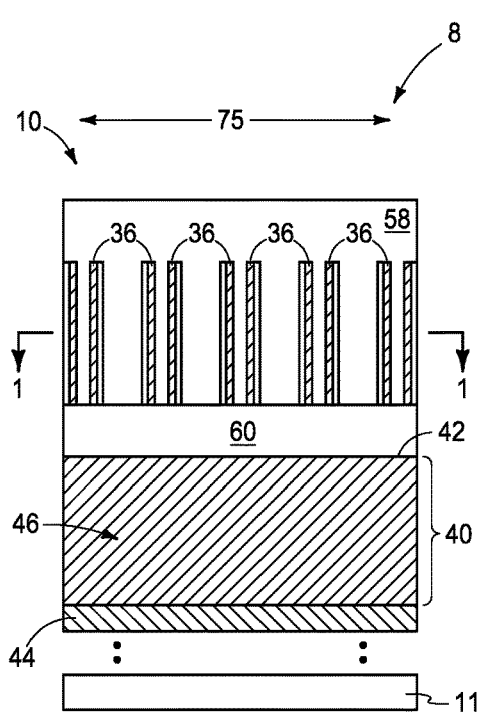
FIG. 3 is a diagrammatic cross-sectional view taken through line 3-3 in FIGS. 1, 2, and 4.
Figure 4:
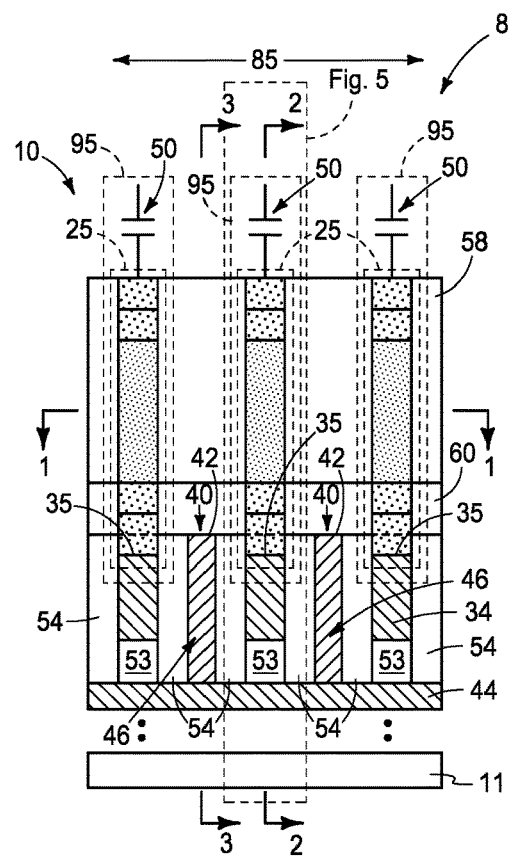
FIG. 4 is a diagrammatic cross-sectional view taken through line 4-4 in FIG. 1.
Figure 7:
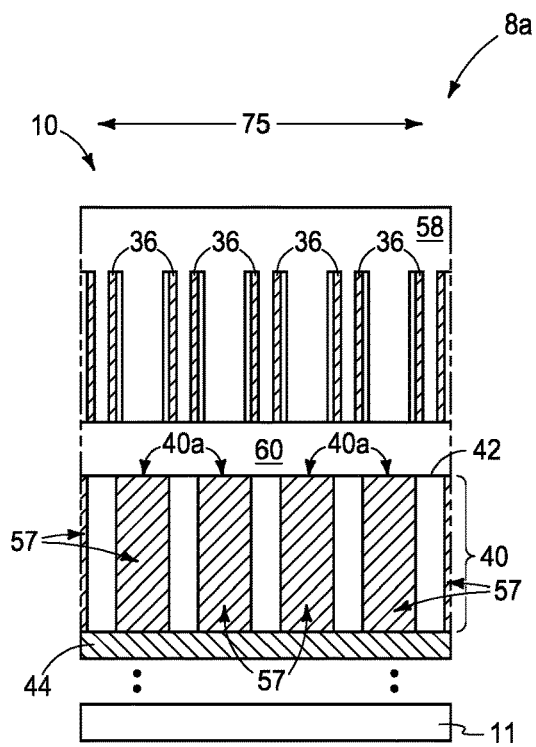
FIG. 7 is a diagrammatic cross-sectional view of an array of vertical transistors in accordance with an embodiment of the invention.
Figure 8:
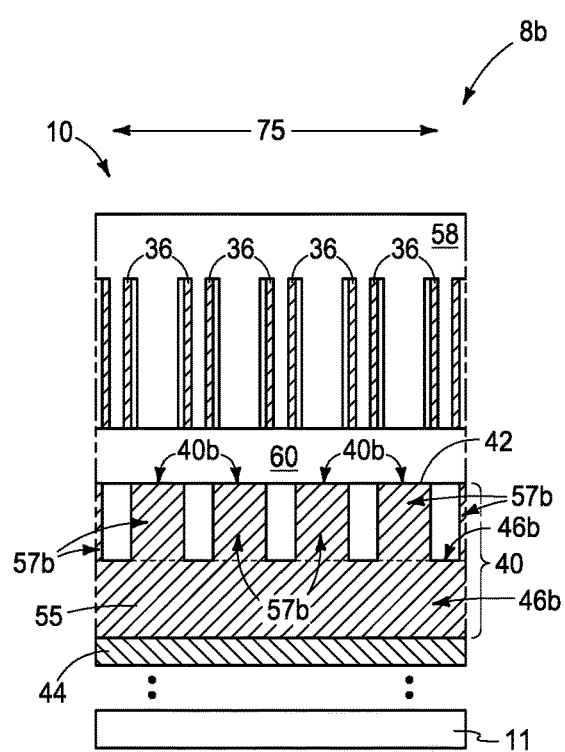
FIG. 8 is a diagrammatic cross-sectional view of an array of vertical transistors in accordance with an embodiment of the invention.
Figure 9:
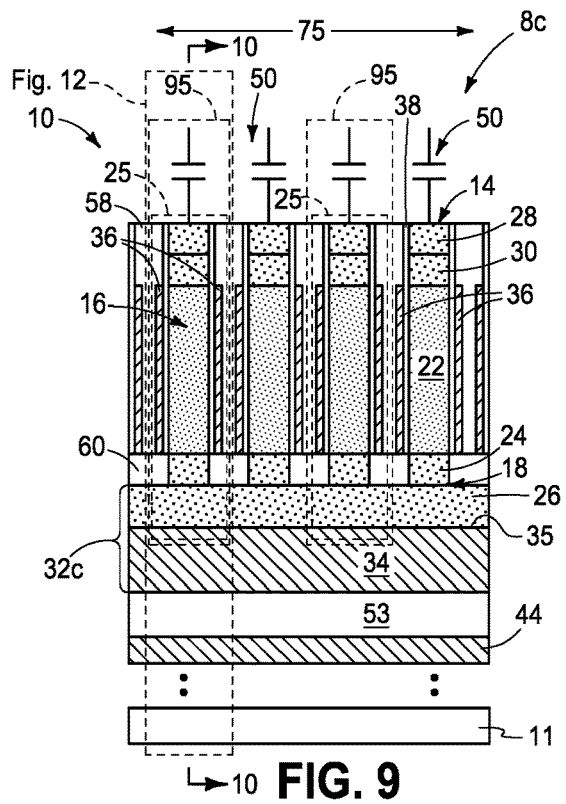
Figure 10:
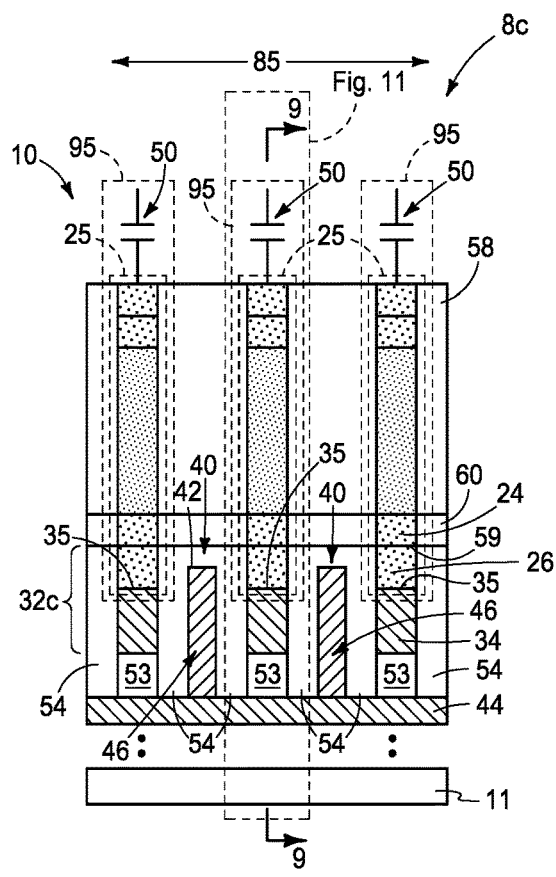
Figure 13:
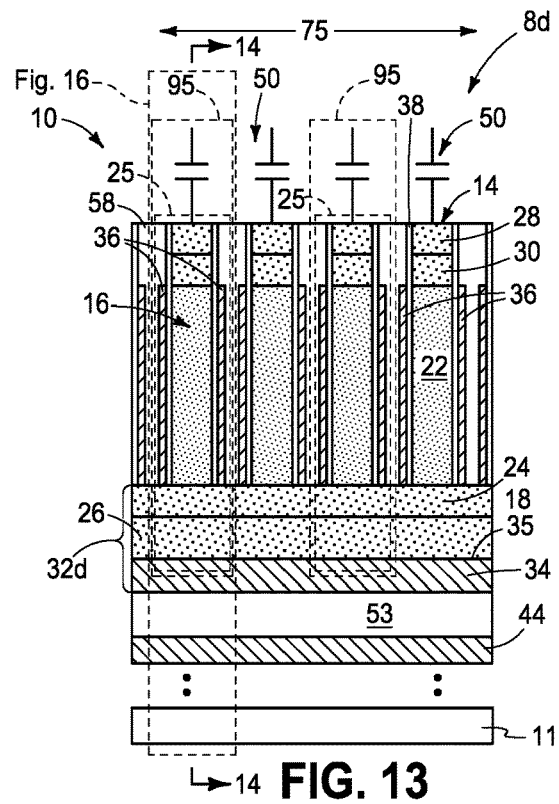
FIGS. 13-16 are diagrammatic cross-sectional views of an array of vertical transistors in accordance with an embodiment of the invention.
Figure 14:
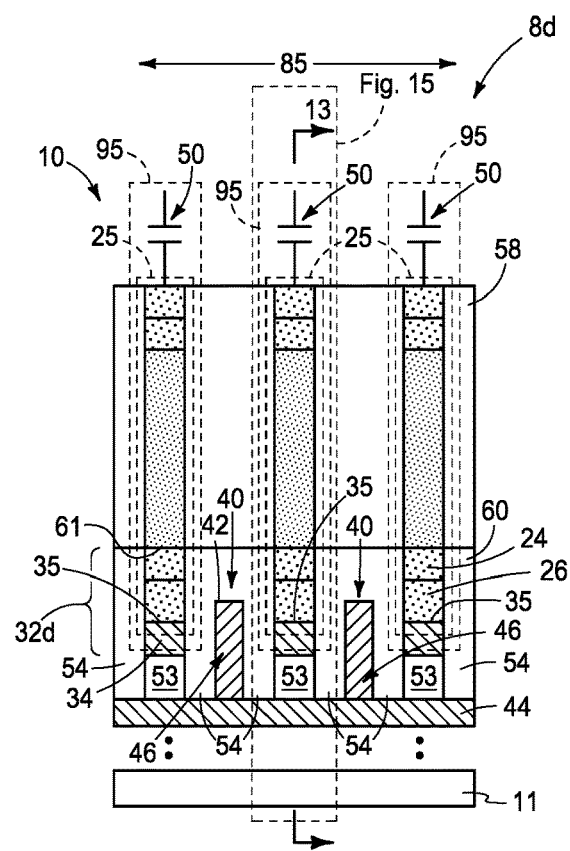
Figure 15:
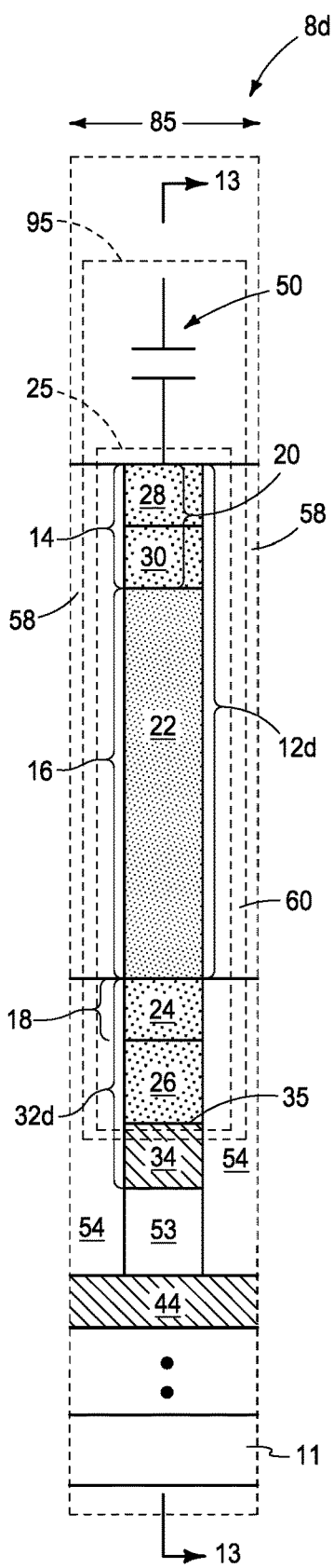
Figure 16:
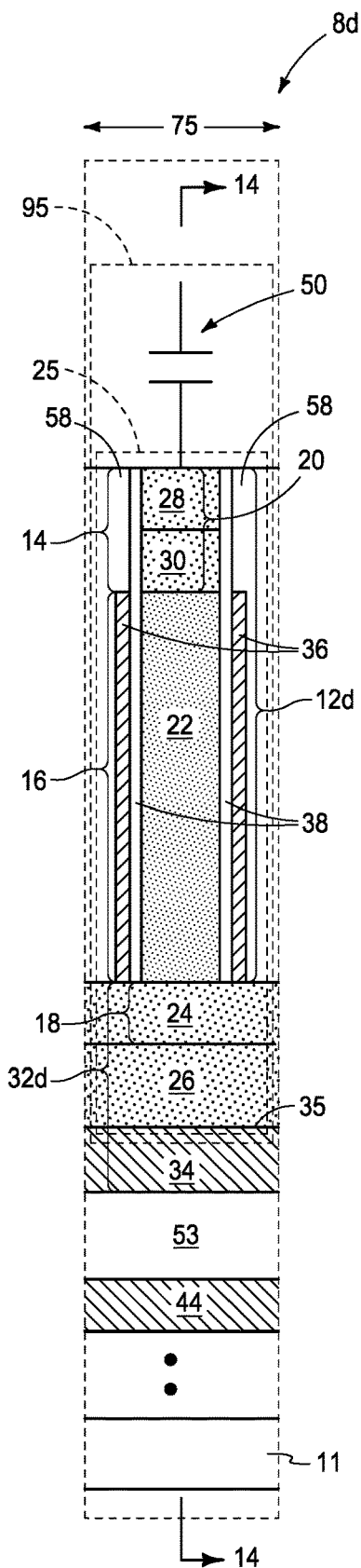

Alternate example conductive structures 40b of a construction 8b are shown with respect to an alternate embodiment in FIG. 8 (compared to the constructions of FIGS. 3 and 7). Like numerals from the above-described embodiments have been used where appropriate, with some construction differences being indicated with the suffix "b" or with different numerals. Conductive structures 40b comprise both conductive lines 46b and spaced conductive pillars 57b, with spaced conductive pillars 57b projecting upwardly from conductive material 55 of conductive lines 46b. Any other attribute(s) or aspect(s) as shown and/or described herein with respect to other embodiments may be used.

An alternate example embodiment construction 8c is shown and described with reference to FIGS. 9-12. Like numerals from the above-described embodiments have been used where appropriate, with some construction differences being indicated with the suffix "c" or with different numerals. Example lower source/drain region 18 in individual pillars 12c comprises first conductive oxide material 24 and conductor lines 32c comprise second conductive oxide material 26 that is below and directly against first conductive oxide material 24 of the respective multiple vertical transistors (e.g., those in a column along column direction 75). In one embodiment, second conductive oxide material 26 of conductor lines 32c is thicker than first conductive oxide material 24 in individual pillars 12c. In one embodiment, metal material 34 of conductor lines 32c is thicker than second conductive oxide material 26 of conductor lines 32c. In one embodiment, top surfaces 42 of conductive structures 40 are elevationally-coincident with bottom surfaces 59 (FIG. 10) of first conductive oxide material 24 of lower source/drain regions 18c of individual pillars 12c. Any other attribute(s) or aspect(s) as shown and/or described herein with respect to other embodiments may be used.

FIGS. 13-16 show an alternate embodiment construction 8d. Like numerals from the above-described. embodiments have been used where appropriate, with some construction differences being indicated with the suffix "d" or with different numerals. Individual pillars 12d comprise upper source/drain region 14 above channel region 16. Conductor lines 32d individually comprise first conductive oxide material 24 atop and directly against second conductive oxide material 26, with second conductive oxide material 26 in conductor lines 32d being atop and directly against metal material 34 in conductor lines 32d. In one embodiment, second conductive oxide material 26 in conductor lines 32d is thicker than first conductive oxide material 24 in conductor lines 32d. In one embodiment, top surfaces 42 of conductive structures 40 are elevationally-coincident with bottom surfaces 61 (FIG. 14) of oxide semiconductor material 22 of channel regions 16 in individual pillars 12. Any other attribute(s) or aspect(s) as shown and/or described herein with respect to other embodiments may be used.

Embodiments of the invention encompass methods used in forming an array of vertical transistors. Example such methods are described with reference to FIGS. 17-35 to result in the example finished construction of FIGS. 1-6. Like numerals from the above-described embodiments have been used for predecessor construction(s), regions, and like/predecessor materials thereof. Any attribute(s) or aspect(s) as shown and/or described herein with respect to structure embodiments may be used in the method embodiments. Likewise, any attribute(s) or aspect(s) as shown and/or described herein with respect to method embodiments may be used in the structure embodiments.

Referring to FIGS. 17-19, laterally-spaced and horizontally-elongated line constructions 62 have been formed in column direction 75. Line constructions 62 comprise insulator material 53, metal material 34 there-above, and transistor material (e.g., 26/24/22/20) above metal material 34. The transistor material comprises an upper source/drain region 14 above a channel region 16 of what will be individual vertical transistors (not yet shown). The transistor material comprises at least materials 22 and 20 (regardless of whether 20 comprises both of 28 and 30) and may not comprise 26 and 24, for example depending on which of construction embodiments 10/10a/10b, 10c, or 10d is being fabricated. Insulator material 53 of line constructions 62 is above conductive material and in one embodiment as shown, directly there-against (e.g., conductive material of common conductor/plate 44).

Figure 20:
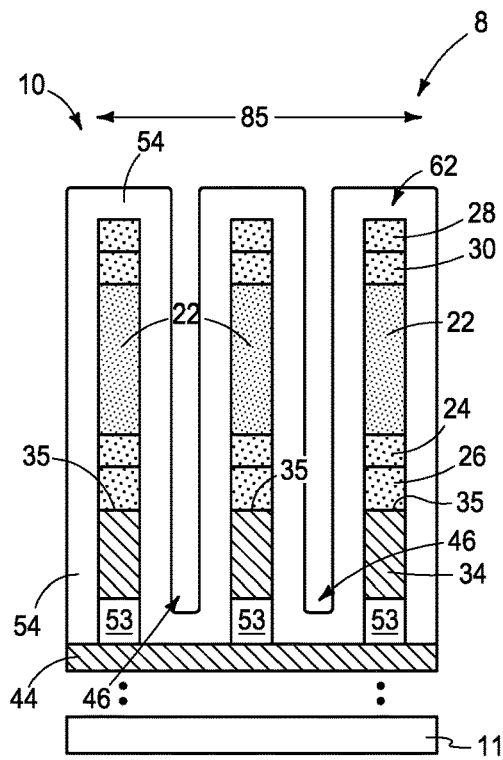
Figure 21:
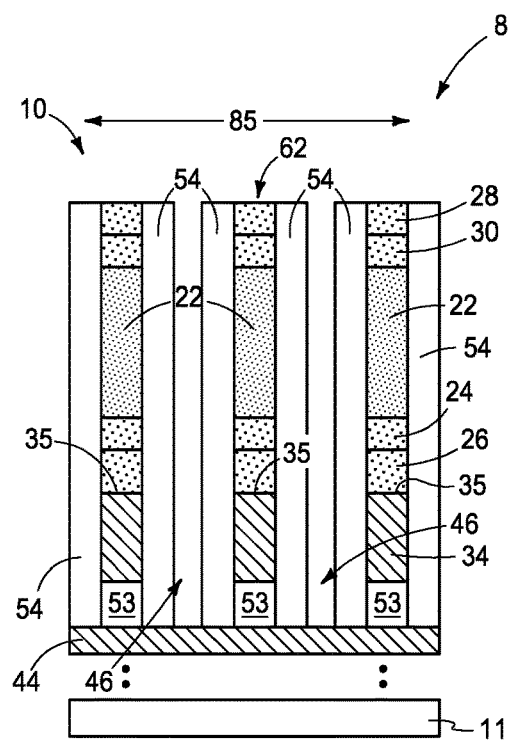

Referring to FIG. 20, such shows processing subsequent to that shown by FIG. 19. Insulating material 54 has been formed (e.g., as a conformal layer) as part of construction 8. FIG. 21 shows subsequent processing whereby insulator material 54 has been anisotropically etched (e.g., in a spacer-like-forming manner that is maskless at least within array 10) to substantially remove insulator material 54 from being over horizontal surfaces. FIGS. 20 and 21 show but one example method of forming insulator material 54 on lateral sides of insulator material 53, metal material 34, and the transistor material. Any alternate existing or future-developed technique may be used.

Figure 22:
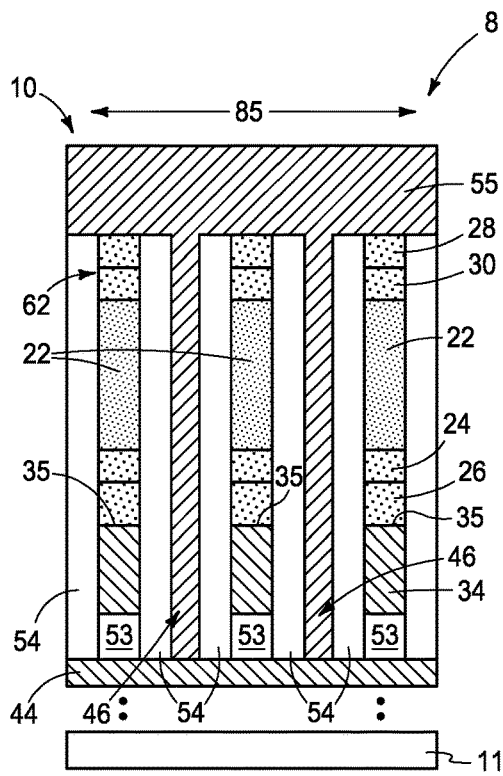
Figure 23:
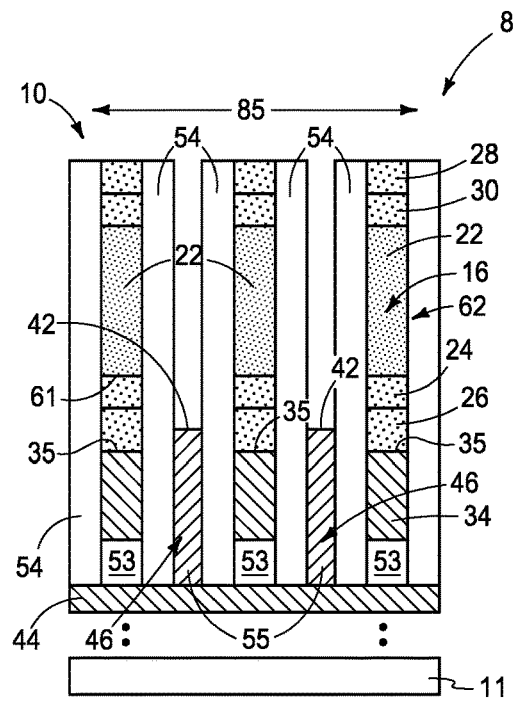
Figure 24:
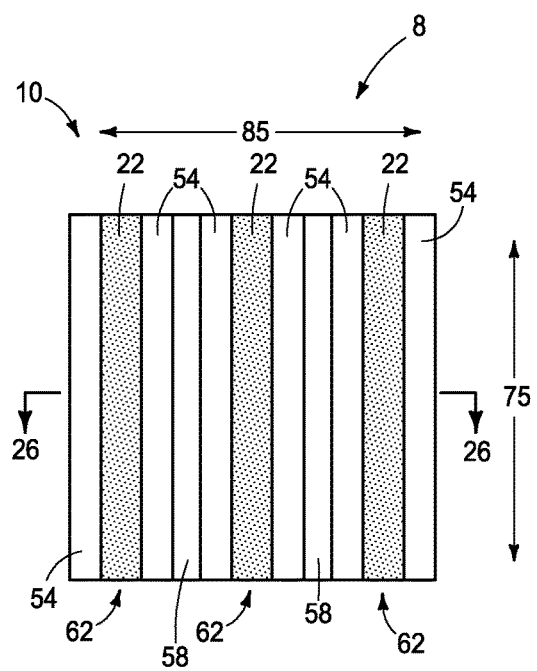
Figure 25:
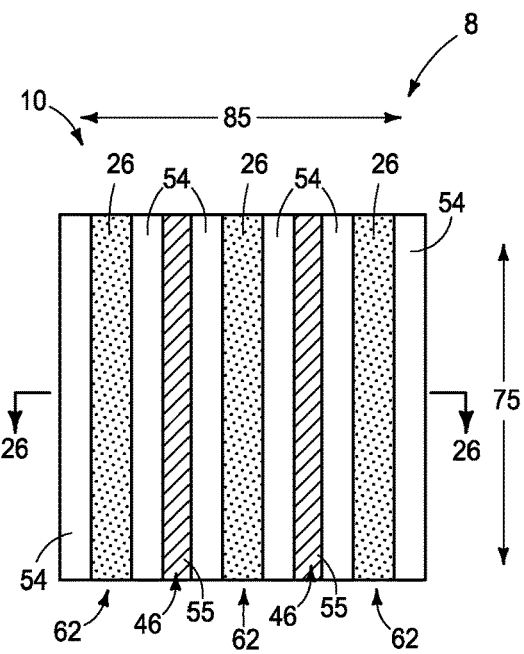
Figure 26:
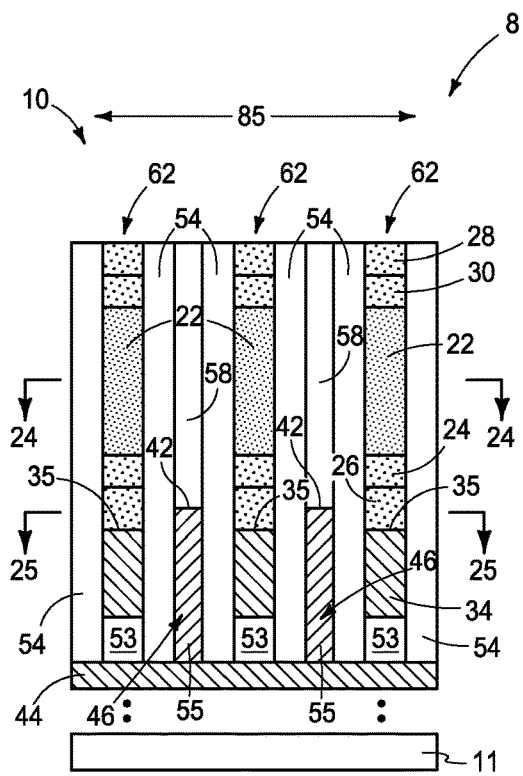
Figure 27:
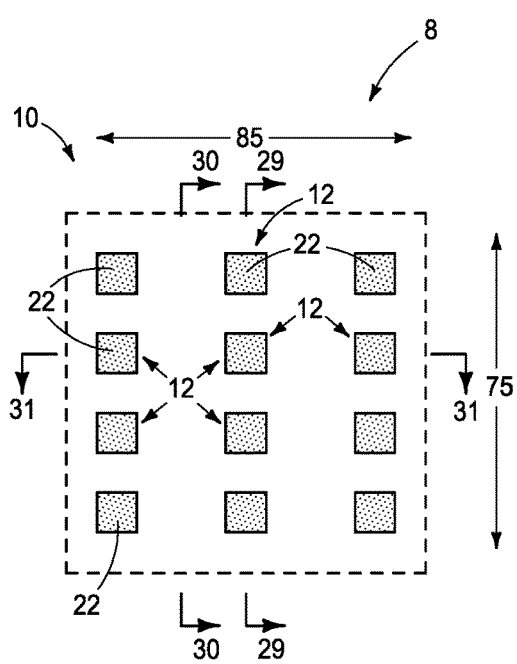
Figure 28:
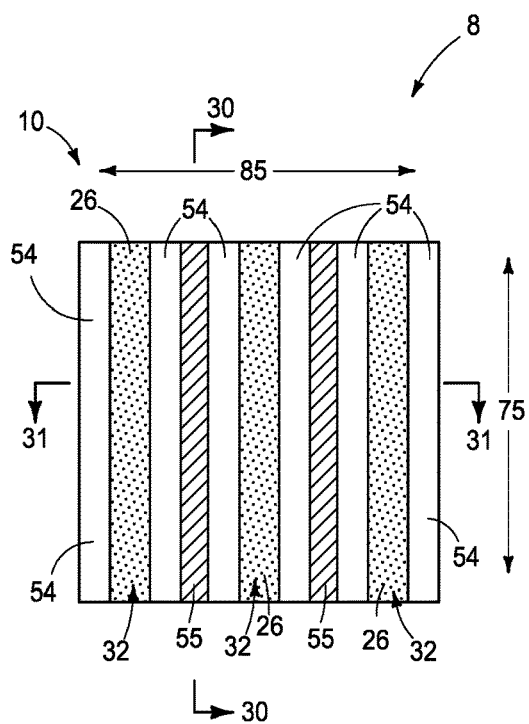
Figure 29:
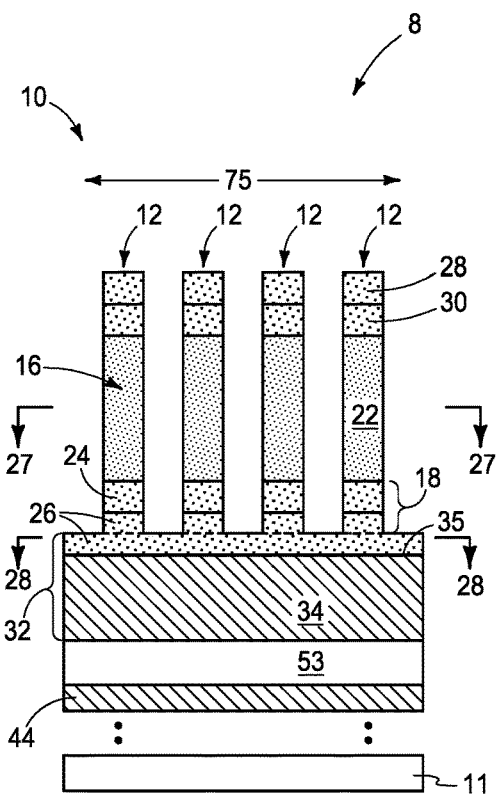
Figure 30:
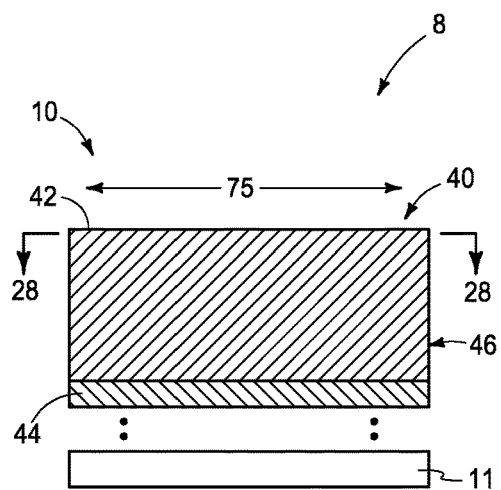
Figure 31:
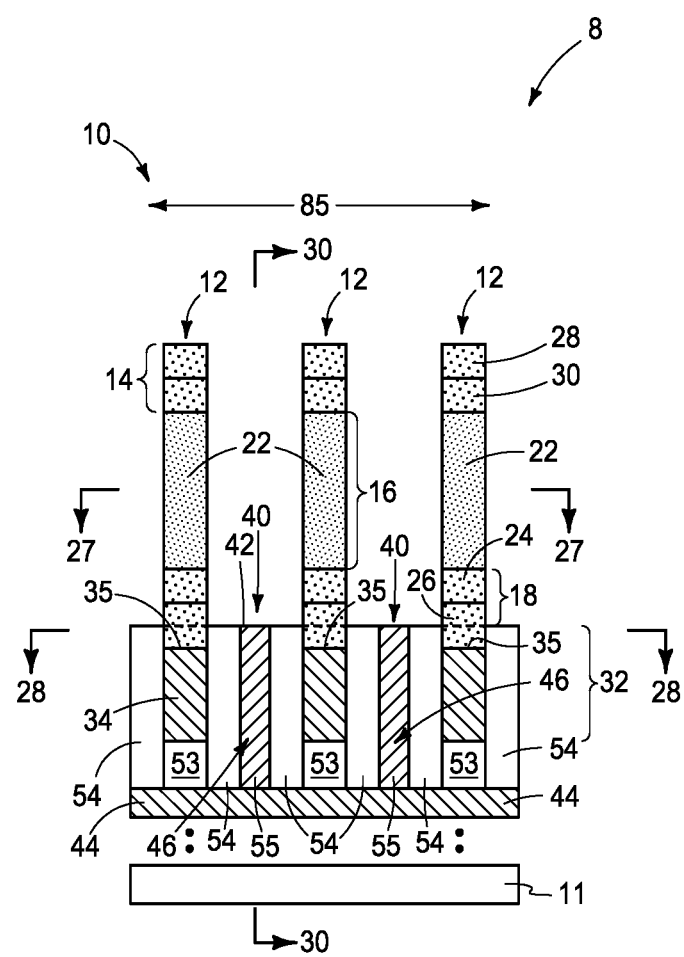
Figure 32:
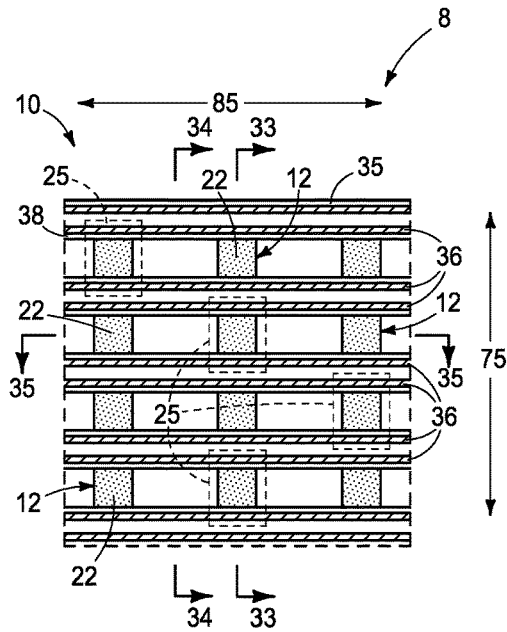
Figure 33:
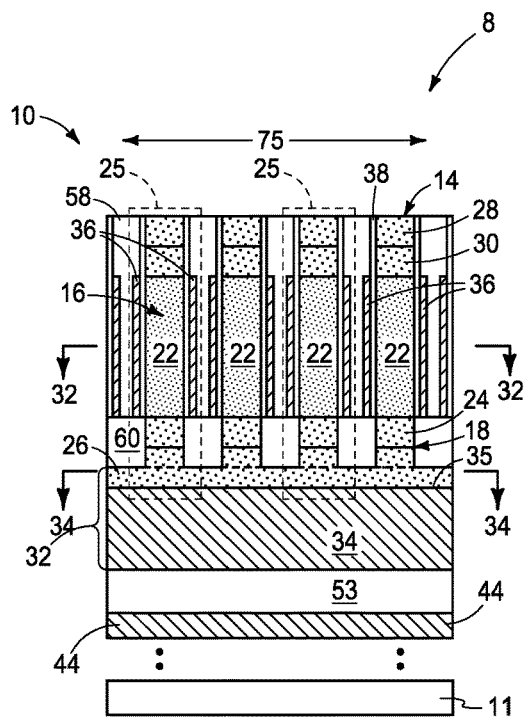
Figure 34:
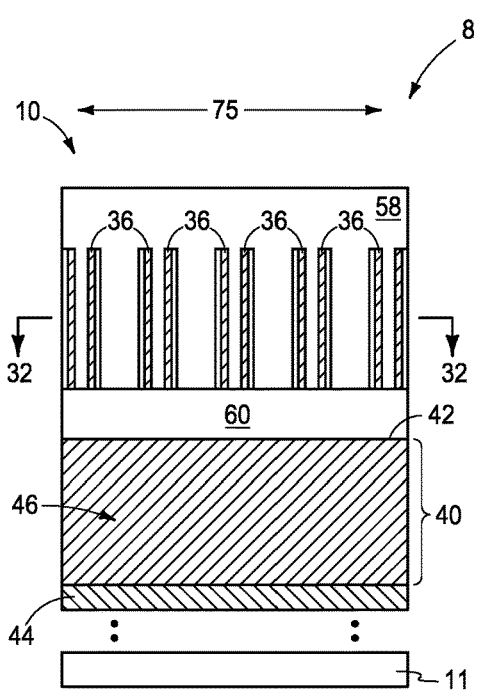
Figure 35:
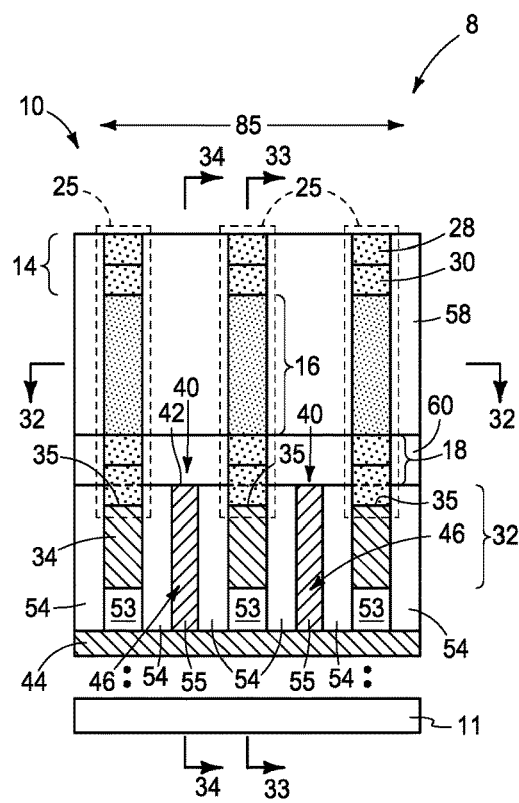

Referring to FIG. 22, conductive material 55 has been formed in the spaces laterally-between and atop line constructions 62 between laterally-adjacent insulator material 54. FIG. 23 shows etching such back to form horizontally-elongated conductive lines 46 in column direction 75 between immediately-laterally-adjacent line constructions 62 and that are directly against conductive material 44. Conductive lines 46 individually comprise a top surface 42 that is higher than a top surface 35 of metal material 34 and at or below a bottom 61 of material 22 of what will comprise the channel region. Such in one embodiment is but one example manner of forming conductive lines 46 individually to be self-aligned in row direction 85. FIGS. 24-26 show subsequent formation of insulating material 58 over conductive lines 46 followed by planarizing such back at least to a top surface of line constructions 62.

Referring to FIGS. 27-31, and after forming conductive lines 46, example transistor material 28/30/22/24/26 has been cut (e.g., by etching using a photolithographic or other mask) to form spaced pillars 12 individually comprising upper source/drain region 14 and channel region 16 of individual vertical transistors. In one embodiment and as shown, such cutting has also formed pillars 12 to individually comprise lower source/drain region 18. More than one etching chemistry may be used or needed for etching example transistor material 28/30/22/24/26, may stop on conductive material 55, may etch into conductive material 55, and/or in latter-most stage(s) of such cutting be conducted as a timed-etch to produce the example construction.

FIGS. 32-35 show example subsequent processing wherein a horizontally-elongated conductive gate line 36 has been formed operatively aside channel region 16 of individual pillars 12 and that interconnects a respective plurality (e.g., a row) of vertical transistors 25 in row direction 85. Insulator material 60 may be deposited and etched back as shown to provide a surface against which gate insulator 38 and conductive material of gate lines 36 may be deposited to be vertically self-aligned relative to an upper surface of material 60, ultimately followed by deposition of insulating material 58 there-atop and there-aside as shown. Subsequent processing may be conducted, if desired, to produce the construction as shown in FIGS. 1-6 (e.g., to form memory elements 50).

In one embodiment, conductive lines 46/46b remain in a finished construction of the array, for example to produce constructions 8 or 8b as shown and described above, Alternately, and by way of example only, conductive lines 46 may be cut so they do not remain in a finished construction of the array, for example to produce construction 8a as shown and described above to form spaced conductive pillars 57.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, docks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Herein, "self-aligned" or "self-aligning" means a technique whereby at least one pair of opposing edges of a structure is formed by a pair of previously-defined edges, thereby not requiring subsequent photolithographic processing with respect to those opposing edges. Herein, "vertically-self-aligned" means a technique whereby length and position of some or all of an elevationally-extending feature is formed by previously-defined lower surface.

Unless otherwise indicated, use of "or" herein encompasses either and both.

Conclusion

In some embodiments, an array of vertical transistors comprises spaced pillars of individual vertical transistors that individually comprise an upper source/drain region, a lower source/drain region, and a channel region vertically there-between. The upper source/drain region comprises a conductor oxide material in individual of the pillars. The channel region comprises an oxide semiconductor material in the individual pillars. The lower source/drain region comprises a first conductive oxide material in the individual pillars atop and directly against a second conductive oxide material in the individual pillars. Horizontally-elongated and spaced conductor lines individually interconnect a respective multiple of the vertical transistors in a column direction. The conductor lines individually comprise the second conductive oxide material atop and directly against metal material. The first conductive oxide material, the second conductive oxide material, and the metal material comprise different compositions relative one another. The second conductive oxide material of the conductor lines is below and directly against the second conductive oxide material of the lower source/drain region of the individual pillars of the respective multiple vertical transistors. Horizontally-elongated and spaced conductive gate lines are individually operatively aside the oxide semiconductor material of the channel region of the individual pillars and individually interconnect a respective plurality of the vertical transistors in a row direction. A conductive structure is laterally-between and spaced from immediately-adjacent of the spaced conductor lines in the row direction. The conductive structures individually comprise a top surface that is higher than a top surface of the metal material of the conductor lines.

In some embodiments, an array of vertical transistors comprises spaced pillars of individual that individually comprise an upper source/drain region, a lower source/drain region, and a channel region vertically there-between. The upper source/drain region comprises a conductor oxide material in individual of the pillars. The channel region comprises an oxide semiconductor material in the individual pillars. The lower source/drain region comprises a first conductive oxide material in the individual pillars. Horizontally-elongated and spaced conductor lines individually interconnect a respective multiple of the vertical transistors in a column direction. The conductor lines individually comprise a second conductive oxide material atop and directly against metal material. The first conductive oxide material, the second conductive oxide material, and the metal material comprise different compositions relative one another. The second conductive oxide material of the conductor lines is below and directly against the first conductive oxide material of the lower source/drain region of the individual pillars of the respective multiple vertical transistors. Horizontally-elongated and spaced conductive gate lines are individually operatively aside the oxide semiconductor material of the channel region of the individual pillars and individually interconnect a respective plurality of the vertical transistors in a row direction. A conductive structure is laterally-between and spaced from immediately-adjacent of the spaced conductor lines in the row direction. The conductive structures individually comprise a top surface that is higher than a top surface of the metal material of the conductor lines.

In some embodiments, an array of vertical transistors comprises spaced pillars of individual vertical transistors that individually comprise an upper source/drain region above a channel region. The upper source/drain region comprises a conductor oxide material in individual of the pillars. The channel region comprises an oxide semiconductor material in the individual pillars. Horizontally-elongated and spaced conductor lines individually interconnect a respective multiple of the vertical transistors in a column direction. The conductor lines individually comprise a first conductive oxide material, a second conductive oxide material, and a metal material. The first conductive oxide material, the second conductive oxide material, and the metal material comprise different compositions relative one another. The first conductive oxide material in the conductor lines is atop and directly against the second conductive oxide material in the conductor lines. The second conductive oxide material in the conductor lines is atop and directly against the metal material in the conductor lines. The first conductive oxide material of the conductor lines is below and directly against the oxide semiconductor material of the channel regions of the individual pillars of the respective multiple vertical transistors. Horizontally-elongated and spaced conductive gate lines are individually operatively aside the oxide semiconductor material of the channel region of the individual pillars and individually interconnect a respective plurality of the vertical transistors in a row direction. A conductive structure is laterally-between and spaced from immediately-adjacent of the spaced conductor lines in the row direction. The conductive structures individually comprise a top surface that is higher than a top surface of the metal material of the conductor lines.

In some embodiments, a method used in forming an array of vertical transistors comprises forming laterally-spaced and horizontally-elongated line constructions in a column direction. The line constructions comprise insulator material, metal material above the insulator material, transistor material above the metal material, and insulating material on lateral sides of the insulator material, the metal material, and the transistor material. The transistor material comprises an upper source/drain region above a channel region of what will be individual vertical transistors. The insulator material of the line constructions is above conductive material. A horizontally-elongated conductive line is formed in the column direction between immediately-laterally-adjacent of the line constructions and directly against the conductive material. The conductive lines individually comprise a top surface that is higher than a top surface of the metal material and at or below a bottom of the channel region. After the conductive lines are formed, the transistor material is cut to form spaced pillars individually comprising the upper source/drain region and the channel region of the individual vertical transistors. A horizontally-elongated conductive gate line is formed operatively aside the channel region of individual of the pillars that interconnects a respective plurality of the vertical transistors in a row direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an array of vertical transistors, comprising:
    forming laterally-spaced and horizontally-elongated line constructions in a column direction; the line constructions comprising insulator material, metal material above the insulator material, transistor material above the metal material, and insulating material on lateral sides of the insulator material, the metal material, and the transistor material; the transistor material comprising an upper source/drain region above a channel region of what will be individual vertical transistors, the insulator material of the line constructions being above conductive material;
    forming a horizontally-elongated conductive line in the column direction between immediately-laterally-adjacent of the line constructions and directly against the conductive material, the conductive lines individually comprising a top surface that is higher than a top surface of the metal material and at or below a bottom of the channel region;
    after forming the conductive lines, etching the transistor material to form spaced pillars individually comprising the upper source/drain region and the channel region of the individual vertical transistors; and
    forming a horizontally-elongated conductive gate line operatively aside the channel region of individual of the pillars that interconnects a respective plurality of the vertical transistors in a row direction.

2. The method of claim 1 wherein the conductive lines are individually formed to be self-aligned in the row direction.

3. The method of claim 1 wherein the conductive lines remain in a finished construction of the array.

4. The method of claim 1 comprising etching the conductive lines so they do not remain in a finished construction of the array.

5. The method of claim 1 comprising etching the conductive lines to form spaced conductive pillars projecting upwardly from the conductive material.

6. The method of claim 1 comprising etching the conductive lines to form spaced conductive pillars projecting upwardly from conducting material of conductive lines.

7. The method of claim 1 comprising forming the upper source/drain region of the transistor material to comprise conductor oxide material.

8. The method of claim 7 wherein the conductor oxide material of the upper source/drain region comprises a first conductor oxide material above and directly against a second conductor oxide material, the first and second conductor oxide materials comprising different compositions relative one another.

9. The method of claim 1 comprising forming the transistor material to comprise a lower source/drain region below the channel region, the lower source/drain region comprising first conductive oxide material.

10. The method of claim 9 wherein the transistor material of the lower source/drain region comprises a second conductive oxide material below and directly against the first conductive oxide material, the first and second conductive oxide materials comprising different compositions relative one another.

11. The method of claim 1 wherein the first and second conductive oxide materials comprise indium tin oxide.

12. The method of claim 1 wherein the first and second conductive oxide materials comprise indium oxide.

13. The method of claim 1 wherein the first and second conductive oxide materials comprise tin oxide.

14. The method of claim 1 wherein the first and second conductive oxide materials comprise zinc oxide.

15. The method of claim 1 wherein the first and second conductive oxide materials comprise titanium oxide.

16. The method of claim 1 wherein the first and second conductive oxide materials comprise ruthenium oxide.

17. The method of claim 1 wherein the channel region comprises an oxide semiconductor material.

18. The method of claim 17 wherein the oxide semiconductor material comprises one or more of $Zn_xSn_yO$, $In_xZn_yO$, $Zn_xO$, $In_xGa_ySi_zO$, $In_xGa_ySi_zO_a$, $In_xW_yO$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Al_xZn_ySn_zO$, $Ga_xZn_ySn_zO$, $Zr_xZn_ySn_zO$, and $In_xGa_ySi_zO$.

19. The method of claim 1 wherein the vertical transistors comprise individual memory cells of a memory array.

* * * * *